United States Patent [19]

Armant et al.

[11] Patent Number: 4,971,715
[45] Date of Patent: Nov. 20, 1990

[54] PHENOLIC-FREE STRIPPING COMPOSITION AND USE THEREOF

[75] Inventors: Richard G. Armant, Vestal; Edward L. Arrington, Owego; Anilkumar C. Bhatt, Johnson City; Donald M. Egleton, Endicott; Frederick M. Ortloff, Binghamton; Joseph J. Sniezek, Endwell; John A. Welsh, Binghamton, all of N.Y.

[73] Assignee: International Business Machines Corporation, Armonk, N.Y.

[21] Appl. No.: 272,847

[22] Filed: Nov. 18, 1988

[51] Int. Cl.$^5$ ............................ C11D 7/50; C11D 1/12
[52] U.S. Cl. .................................... 252/143; 252/162; 252/170; 252/547; 252/558; 252/DIG. 8; 134/38
[58] Field of Search ................. 252/DIG. 8, 143, 162, 252/170, 549, 558; 134/38; 430/329, 331

[56] References Cited

U.S. PATENT DOCUMENTS

| | | | |
|---|---|---|---|
| 2,866,726 | 12/1958 | Vance | 134/23 |
| 3,232,881 | 2/1966 | Kapalko et al. | 252/143 |
| 3,869,313 | 3/1975 | Jones et al. | 134/73 |
| 3,871,929 | 3/1975 | Schevey et al. | 156/2 |
| 3,873,313 | 3/1975 | Horst et al. | 96/36 |
| 4,165,294 | 8/1979 | Vander Mey | 134/38 |
| 4,165,295 | 8/1979 | Vander Mey | 252/143 |
| 4,169,068 | 9/1979 | Harita et al. | 252/143 |
| 4,187,191 | 2/1980 | Simpson, Jr. | 252/143 |
| 4,202,703 | 5/1980 | Zuber et al. | 134/2 |
| 4,215,005 | 7/1980 | Vander Mey | 134/38 |
| 4,221,674 | 9/1980 | Vander May | 252/141 |
| 4,242,218 | 12/1980 | Vander Mey | 252/143 |
| 4,304,681 | 12/1981 | Martin et al. | 252/143 |
| 4,395,348 | 7/1983 | Lee | 252/143 |
| 4,426,311 | 1/1984 | Vander Mey | 252/143 |
| 4,491,530 | 1/1985 | Thomas | 252/143 |

Primary Examiner—Paul Lieberman
Assistant Examiner—Alexander G. Ghyka
Attorney, Agent, or Firm—Pollock, Vande Sande and Priddy

[57] ABSTRACT

A stripping composition containing O-dichlorobenzene, dodecylbenzene sulfonic acid, perchloroethylene, and optionally an aromatic hydrocarbon containing at least 8 carbon atoms, and use thereof for removing photoresist.

18 Claims, No Drawings

PHENOLIC-FREE STRIPPING COMPOSITION AND USE THEREOF

DESCRIPTION

1. Technical Field

The present invention is concerned with a composition for stripping photoresist from a substrate. In particular, the present invention is concerned with a composition that is free of phenolic compounds. The present invention is concerned with a composition that contains O-dichlorobenzene, dodecylbenzene sulfonic acid and perchloroethylene that is a relatively fast and effective stripping composition. The compositions of the present invention are especially suitable for stripping negative resists.

2. Background Art

One widely used method for forming a pattern on an inorganic substrate such as metallic circuitry in the manufacture of printed circuit boards in integrated circuits is to form a layer of photoresist material over the substrate or over a metal coated substrate in those areas to be shielded from metal deposition or metal removal. The photoresist layer is normally formed of a polymeric, organic material that is substantially unaffected by the metal deposition or metal removal process and, accordingly, protects the underlying areas of the substrate. Numerous photoresists for such are well-known and are capable of forming the desired masking pattern on the desired substrate upon exposure to actinic light through a photographic image by photolithographic techniques.

Photoresists can be positive or negative photoresists. Positive photoresists are materials which, upon exposure to actinic light such as X-ray, U.V. radiation, or electron beam radiation, become soluble in a developer composition, while the unexposed portions remain insoluble. In the case of a positive photoresist, upon development, the solubilized, exposed portions are removed, leaving the insoluble, unexposed portions of the resist layer on the substrate in the pattern of the photographic image.

Negative photoresists, on the other hand, become insolubilized upon exposure to actinic light. In the case of negative photoresists, the unexposed portions are removed by a developer composition, while the exposed insolubilized portion remains on the substrate. Typical negative photoresists are based upon cyclicized rubber-based compositions. Normally, such are from polyisoprene or derivatives of polyisoprene rubbers.

Subsequent to putting down or etching away the metal oxide layers on the exposed portions of the substrate, it is necessary to remove the remaining photoresist layer. This removal process must not adversely affect either the substrate or the metallic layers present thereon.

The materials employed in the manufacture of printed circuit boards or cards include a variety of inorganic substrate materials and particularly ceramics such as aluminum oxides, silicon oxide, and aluminum silicate. The substrates are coated with metals such as chromium and copper and may also include various polymeric materials such as polyimides.

The compositions used to strip the photoresist material must act without corroding, dissolving, or dulling the surface of such materials and without chemically altering the material forming the substrate.

Among the more widely employed stripping compositions are those that contain phenol or other similar phenolic compounds. However, such compositions are not especially desirable since the phenolics are toxic and create an environmental hazard.

SUMMARY OF INVENTION

The present invention is concerned with a composition for stripping a photoresist that does not contain phenol or phenolic compounds and, yet, is extremely effective.

The compositions of the present invention are especially suitable for removing negative photoresist materials and especially those from cyclicized rubbers such as cyclicized polyisoprene and derivatives of polyisoprene. In addition, the compositions of the present invention effectively remove the negative photoresists without attacking, to any significant degree, the substrate such as the ceramic, metals such as chromium and copper, and various organic polymeric materials such as cured polyimide. The compositions of the present invention can also be applied to chromium silicides and other glassy insulating materials.

In order to achieve the results required by the present invention, the compositions must include very specific limited amounts of O-dichlorobenzene, dodecylbenzene sulfonic acid, perchloroethylene, and optionally an aromatic hydrocarbon.

In particular, the compositions of the present invention are phenolic-free and contain about 42.5% to about 43.5% by weight of O-dichlorobenzene, about 18.5% to about 19.5% by weight of dodecylbenzene sulfonic acid, about 18.5% to about 38.5% by weight of perchloroethylene, and up to about 19.5% by weight of an aromatic hydrocarbon containing at least 8 carbon atoms.

In addition, the present invention is concerned with stripping a photoresist from a substrate by contacting the photoresist with the above-defined composition.

BEST AND VARIOUS MODES FOR CARRYING OUT INVENTION

The compositions of the present invention contain about 42.5% to about 43.5% and preferably about 43% by weight of O-dichlorobenzene, about 18.5% to about 19.5% and preferably about 19% by weight of dodecylbenzene sulfonic acid, about 18.5% to about 38.5% by weight of perchloroethylene, and 0% to about 19.5% by weight of an aromatic hydrocarbon containing at least 8 carbon atoms.

The preferred aromatic hydrocarbons are xylene or Hi-Sol-10 ® or Sol-G ®. The aromatic hydrocarbons employed generally contain at least 8 carbon atoms and have boiling points starting at about 135° C. Hi-Sol-10 ® has an initial boiling point of about 155° C., 50% boiling at about 165° C., and a dry point of about 177° C. Sol-G ® has an initial boiling point of about 183° C., 50% boiling at about 192° C., and a dry point of about 208° C.

The compositions of the present invention have initial boiling points of about 120° C. at 760 mm Hg pressure, 50% boiling at about 155° C. to about 166° C., and a dry point of about 180° C. to about 183° C.

A preferred composition of the present invention contains about 43% by weight of O-dichlorobenzene, about 19% by weight of dodecylbenzene sulfonic acid, and about 38% by weight of perchloroethylene.

Another preferred composition of the present invention contains about 43% by weight of O-dichlorobenzene, about 19% of dodecylbenzene sulfonic acid, about 19% by weight of perchloroethylene, and about 19% by weight of the aromatic hydrocarbon containing at least 8 carbon atoms and preferably Hi-Sol-10 ®.

The photoresists removed by the strippers of the present invention are preferably negative photoresists and most preferably the cyclicized rubber compositions such as cyclicized polyisoprene. Examples of such photoresist materials include Kodak KTFR ® and Waycoat SC-100 ®.

The compositions of the present invention are preferably employed at temperatures of about 85° C. to about 100° C.

A typical sequence of employing the compositions of the present invention involves providing on a substrate, such as a ceramic substrate, a layer of chromium, followed by a layer of copper, followed by a top layer of chromium, and then the negative photoresist such as Kodak KTFR ® or Waycoat SC-100 ®. The process of employing the compositions can, of course, also be applied towards other substrates such as chromium silicides and other glassy insulating materials. The photoresist is imagewise exposed to actinic radiation to the desired pattern such as using a laser, for example, at about 40 to about 90 millijoules/cm$^2$. The magnitude of the energy will vary depending upon the complexity of the product desired. After exposure, the unexposed portions of the photoresist are removed by developing such as using 1,1,1-trichloroethane. Substrates are typically assembled in horizontal fixtures while processing. Typically, the 1,1,1-trichloroethane is sprayed at a pressure of about 6±1 psi to the top side of the substrate and to the bottom side of the substrate at a pressure of about 10±1 psi at temperatures of about 10° C. to about 18.5° C., typically about 15.5° C., followed by a rinse in 1,1,2-trichloro,1,2,2-trifluoroethane at temperatures of about 4.5° C. to about 15.5° C., typically about 10° C. and pressures of about 6±1 psi on the top side of the substrate and about 10±1 psi on the bottom side of the substrate. The photoresist can then be post-baked such as about 120° C. to about 140° C. for about 15 minutes to about 55 minutes and, more usually, at about 130° C. to about 138° C. at about 45 minutes to about 55 minutes.

The desired pattern in the metal is then obtained by etching the chromium and copper not protected by the remaining negative photoresist. In a typical example, the top chromium layer is etched employing a potassium permanganate and sodium hydroxide bath. The residence time of the substrate is for about 61±1 second at about 44° C.±1° C. in the bath. The copper is etched in a conventional copper etchant such as ferric chloride or an equivalent solution at about 29° C.±2° C. for about 61±1 second. The bottom chromium layer is then etched employing a potassium permanganate and sodium hydroxide bath. The residence time of the substrate in the bath is for about 61±1 second at about 44° C.±1° C. An oxalic acid treatment is then employed for about 72±1 second at about 24° C.±8° C. Each chemical treatment is followed by a deionized water rinse with times typically comparable to the etching and treatment times.

The remaining negative photoresists can then be stripped employing the above-defined compositions. In preferred aspects of the present invention, the parts are subjected to two separate treatments in the compositions of the present invention for about 55 seconds to about 65 seconds each at temperatures of about 85° C. to about 100° C.

The parts are cleaned prior to further treatment. A typical cleaning involves three separate rinses with xylene at about 25° C., a rinse with isopropyl alcohol at about 25° C., followed by two rinses in a detergent solution such as Neutra Clean 68 ® from Shipley. The first such treatment being at about 63° C. to about 73° C. and the second treatment being at about 13° C. to about 23° C. The part is then subjected to about four rinses in deionized water at about 25° C., followed by another isopropyl alcohol rinse at about 25° C., and finally two drying steps employing hot air at about 65° C. to about 110° C. Each preceding rinsing/cleaning/drying step is for about 55 seconds to about 65 seconds.

After this, a polyimide layer can be provided on the precleaned metal circuitry and cured, followed by providing layers of chromium, copper, and chromium. Next, the negative photoresist is provided on the top chromium layer with the photoresist being removed in the same manner as discussed above for providing the first level of circuitry on the substrate.

Then the substrate processing is completed by a pinning application and followed by a conventional solder dip process.

The following non-limiting examples are presented to further illustrate the present invention:

EXAMPLE 1

A ceramic substrate is cleaned by washing in an Igepal ® detergent solution, followed by a rinse in deionized water, 1,1,2-trichloro,1,2,2-trifluoroethane, and then hot air drying. A layer of chromium is provided on the substrate by sputtering, followed by a layer of copper by sputtering and a second layer of chromium by sputtering. A layer of Kodak KTFR ® photoresist having a molecular weight of about 60,000 is provided on the chromium by spraying. The layer is about 30,000–45,000 angstroms thick. The photoresist is imagewise exposed to actinic energy at about 40 to about 90 millijoules/cm$^2$. The unexposed portion of the photoresist is developed by spraying with 1,1,1-trichloroethane at a pressure of about 6±1 psi applied to the top side of the substrate and a pressure of about 10±1 psi on the bottom side of the substrate at a temperature of about 15.5° C., followed by a rinse in 1,1,2-trichloro,1,2,2-trifluoroethane at a temperature of about 10° C. and a pressure on the top side of the substrate at about 6±1 psi and on the bottom side of the substrate at about 10±1 psi. The photoresist is then post-baked at a temperature of about 130° C. to about 138° C. for about 45 minutes to about 55 minutes.

The chromium and copper layers are then etched in typical chromium and copper etchants. In particular, the top chromium layer is etched employing a potassium permanganate and sodium hydroxide bath in deionized water. The residence time of the substrate in the bath is for about 61±1 second at about 44° C.±1° C. The bath contains about 62±5 grams/liter of potassium permanganate and about 20±2 grams/liter of sodium hydroxide. The copper is etched in a conventional ferric chloride copper etchant at about 29° C.±2° C. for about 61±1 second. The ferric chloride aqueous solution has a specific gravity of about 1.24 to about 1.26. The bottom chromium layer is then etched employing a potassium permanganate and sodium hydroxide bath in deionized water. The residence time of the substrate in the bath is for about 61±1 second at about 44° C.±1° C. The bath contains about 62±5 grams/liter of potassium permanganate and about 20±2 grams/liter of sodium hydroxide. An oxalic acid bath treatment in deionized water is then employed for about 72±1 second at about 24° C.±8° C. The oxalic acid bath composition contains about 80±5 grams/liter. Each chemical treatment is followed by a deionized water rinse with times typically comparable to the etching and treatment times.

Next, the exposed negative photoresist is removed by dipping the part in a composition containing about 43% by weight of O-dichlorobenzene, about 19% by weight of dodecylbenzene sulfonic acid, and about 38% by weight of perchloroethylene at about 85° C. to about 100° C. for about 55 seconds to about 65 seconds. This composition has a density at 20° C. of about 1.3410 grams/cm$^3$, Brookville viscosity at 20° C. of about 5.41 centipoise, initial boiling point of about 123° C.–125° C., 50% boiling at about 165° C., a dry point at about 183° C., a flash point at about 135° C., an acid number of about 34.7, and is self-extinguishing and dark brown in color with nonvolatile content of about 19.9% at 110° C. for 24 hours. The treatment with the above stripping composition results in removal of the photoresist composition.

The part is then further cleaned to remove any residual contamination, such as employing three xylene rinses at about ambient temperature, followed by an isopropyl alcohol rinse at about ambient temperature, followed by two rinses with a mild detergent such as a Neutra Clean 68 ® solution, the first of which is about 63° C. to about 73° C. and the second of which is about 13° C. to about 23° C.

Next, the part is rinsed four times in deionized water at about ambient temperature, followed by a rinse in isopropyl alcohol at about ambient temperature and drying in two hot air chambers at about 65° C. to about 110° C.

A polyimide layer is then provided on the metal circuitry and cured at elevated temperatures of about 218° C. A layer of chromium, followed by a layer of copper, followed by another layer of chromium are provided onto the polyimide by evaporation techniques, and then another layer of the Kodak KTFR ® negative photoresist is provided on the top chromium layer.

The exposure, development, etching, and removal of residual photoresists, and cleaning steps as discussed above are then repeated to remove the second photoresist layer and provide the second level of circuitry.

EXAMPLE 2

The process of Example 1 is repeated, except that the stripping composition consists of about 43% by weight of O-dichlorobenzene, about 19% by weight of dodecylbenzene sulfonic acid, about 19% by weight of perchloroethylene, and about 19% by weight of Hi-Sol-10 ®. This composition has a density at 20° C. of about 1.1861 grams/cm$^3$, Brookville viscosity at 20° C. of about 5.41 centipoise, initial boiling point of about 121° C., a flash point at about 95° C., an acid number of about 34.5, and is self-extinguishing with non-volatile content of about 20.1% at 110° C. for 24 hours. The results obtained are similar to those of Example 1.

EXAMPLE 3

The process of Example 1 is repeated, except that the stripping composition consists of about 43% by weight of O-dichlorobenzene, about 19% by weight of dodecylbenzene sulfonic acid, about 19% by weight of perchloroethylene, and about 19% by weight of xylene. The results obtained are similar to those of Example 1.

Having thus described our invention, what we claim as new and desire to secure by Letters Patent is:

1. A phenolic-free composition for stripping photoresist consisting essentially of:
   A. O-dichlorobenzene
   B. dodecylbenzene sulfonic acid
   C. perchloroethylene
   D. aromatic hydrocarbon containing at least 8 carbon atoms wherein the relative amount of A is about 42.5% to about 43.5% by weight; the relative amount of B is about 18.5% to about 19.5% by weight; the relative amount of C is about 18.5% to about 38.5% by weight; and the relative amount of D is 0% to about 19.5% by weight, the amount being based upon the total amount of said A, B, C, and D.

2. The composition of claim 1 wherein the amount of C is about 37.5% to about 38.5% by weight.

3. The composition of claim 1 wherein the amount of C is about 18.5% to about 19.5% by weight, and the amount of D is about 18.5% to about 19.5% by weight.

4. The composition of claim 3 wherein said aromatic hydrocarbon has an initial boiling point of about 155° C., 50% boiling at about 165° C., and a dry point of about 177° C.

5. The composition of claim 1 which contains about 43% by weight of A; about 19% by weight of B; and about 38% by weight of C.

6. The composition of claim 1 which contains about 43% by weight of A; about 19% by weight of B; about 19% by weight of C; and about 19% by weight of D.

7. A method for stripping a photoresist from a substrate which comprises contacting said photoresist with the composition of claim 1.

8. The method of claim 7 wherein said photoresist is negative photoresist exposed to actinic light.

9. The method of claim 7 wherein the contacting of the photoresist with said composition is at temperatures of about 85° C. to about 100° C.

10. The method of claim 7 which further includes contacting with xylene, followed by isopropyl alcohol, then a detergent, then deionized water, then isopropyl alcohol, and then drying.

11. The method of claim 7 wherein said photoresist is present on a ceramic substrate having chromium and copper circuitry.

12. The method of claim 7 wherein said substrate also has polyimide insulation layer thereon.

13. The method of claim 7 wherein said substrate contains a layer of glassy insulating material.

14. The method of claim 7 wherein said substrate contains a layer of chromium silicide.

15. The method of claim 7 wherein the amount of C in said composition is about 37.5% to about 38.5 % by weight.

16. The method of claim 7 wherein the amount of C is about 18.5% to about 19.5% by weight and the amount of D is about 18.5% to about 19.5% by weight in said composition.

17. The method of claim 16 wherein the aromatic hydrocarbon has an initial boiling point of about 155° C., 50% boiling at about 165° C., and a dry point of about 177° C.

18. The method of claim 7 wherein the composition contains about 43% by weight of A; about 19% by weight of B; about 19% by weight of C; and about 19% by weight of D.

* * * * *